United States Patent
Lee et al.

(10) Patent No.: US 10,510,628 B2
(45) Date of Patent: Dec. 17, 2019

(54) CONTACT PADS FOR ELECTRICAL MODULE ASSEMBLY WITH MULTIDIMENSIONAL TRANSDUCER ARRAYS

(71) Applicant: Siemens Medical Solutions USA, Inc., Malvern, PA (US)

(72) Inventors: BaikWoo Lee, Sammamish, WA (US); Stephen R. Barnes, Bellevue, WA (US); David A. Petersen, Fall City, WA (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 0 days.

(21) Appl. No.: 15/593,134

(22) Filed: May 11, 2017

(65) Prior Publication Data

US 2018/0327256 A1    Nov. 15, 2018

(51) Int. Cl.
| | |
|---|---|
| *H01L 23/00* | (2006.01) |
| *B06B 1/06* | (2006.01) |
| *G01S 15/89* | (2006.01) |
| *G01S 7/52* | (2006.01) |

(52) U.S. Cl.
CPC ............ *H01L 23/00* (2013.01); *B06B 1/0607* (2013.01); *G01S 7/5208* (2013.01); *G01S 15/8925* (2013.01)

(58) Field of Classification Search
CPC ......... B81B 7/0074; B81B 2201/0257; B81B 2203/0127; B81B 2207/053; B81B 2207/07; B81C 1/00238
USPC ......................................................... 257/416
See application file for complete search history.

(56) References Cited

U.S. PATENT DOCUMENTS

| | | | |
|---|---|---|---|
| 6,638,607 | B1 | 10/2003 | Curcio et al. |
| 7,304,415 | B2 | 12/2007 | Petersen et al. |
| 8,754,574 | B2 | 6/2014 | Morris et al. |
| 2006/0035481 | A1 | 2/2006 | Petersen et al. |
| 2009/0015101 | A1 | 1/2009 | Petersen et al. |
| 2012/0267981 | A1* | 10/2012 | Morris ................ A61B 8/4483 310/314 |
| 2016/0271651 | A1 | 9/2016 | Petersen et al. |

* cited by examiner

*Primary Examiner* — Matthew C Landau
*Assistant Examiner* — Dmitriy Yemelyanov

(57) ABSTRACT

For multidimensional transducer array interconnection, circuit boards with electronics are stacked to form a surface for connection with the array. The surface of the circuit boards for connecting with the transducer array is metalized and diced. Rather than relying on small exposed traces, larger contact pads are formed by metalizing the surface and then dicing the surface. This forms an array of contact pads for connecting with the z-axis or other connectors for elements of the multidimensional transducer array.

16 Claims, 7 Drawing Sheets

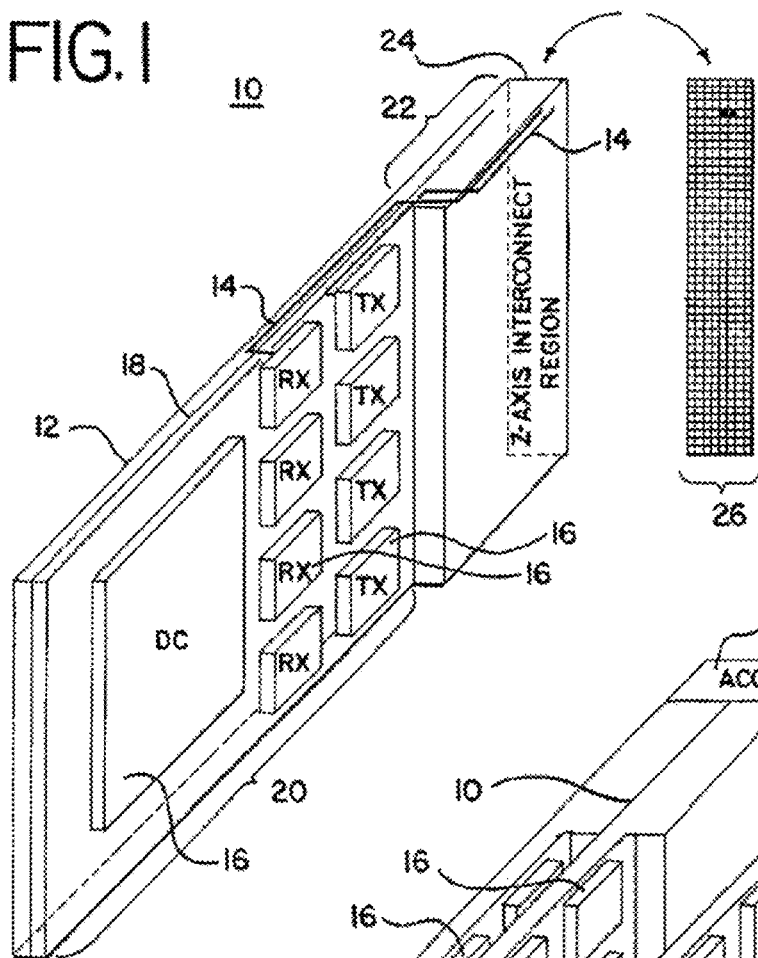
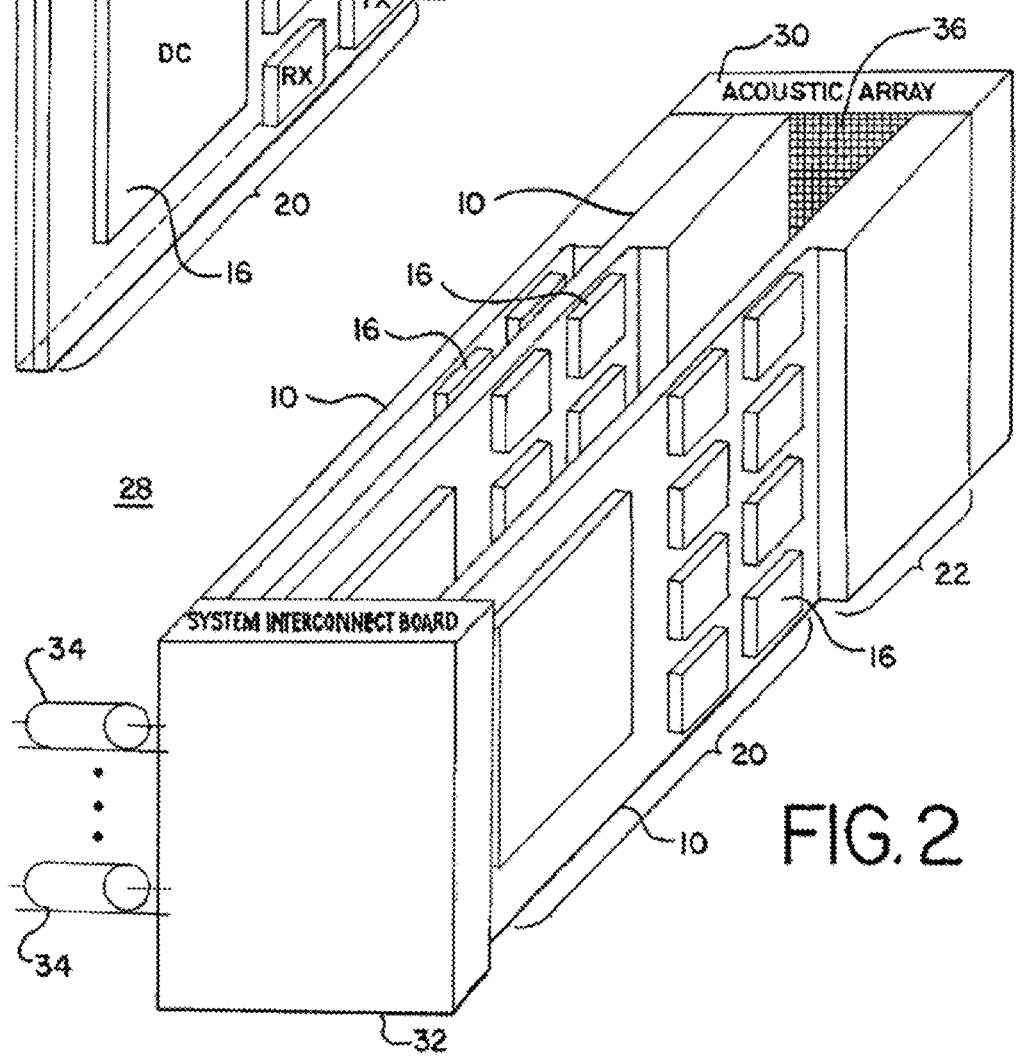

CONTACT PADS FOR ELECTRICAL MODULE ASSEMBLY WITH MULTIDIMENSIONAL TRANSDUCER ARRAYS

BACKGROUND

The present embodiments relate to interconnection of multidimensional transducer arrays with electronics.

Achieving the interconnection between an acoustic array and the associated transmit and/or receive electronics is a key technological challenge for multidimensional (matrix) transducers. Hundreds or thousands of different elements distributed in two dimensions (azimuth and elevation) require interconnection along the z-axis (depth or range) for at least the elements surrounded by other elements. Since the elements are small (e.g., 250 um), there is limited space for separate electrical connection to each element.

U.S. Pat. No. 7,304,415 proposes a modular system where circuit boards stack to form a surface for z-axis connection to the acoustic array. For interconnection, traces in the circuit boards are exposed on the surface. It may be difficult to consistently electrically connect all the exposed traces to the elements of the acoustic array due to the limited size of the traces and tolerances of the circuit boards, traces, and acoustic elements.

SUMMARY

By way of introduction, the preferred embodiments described below include methods, systems and components for multidimensional transducer array interconnection. Circuit boards with electronics are stacked to form a surface for connection with the array. The surface of the circuit boards for connecting with the transducer array is metalized and diced. Rather than relying on small exposed traces, larger contact pads are formed by metalizing the surface and then dicing the surface. This forms an array of contact pads for connecting with the z-axis or other connectors for elements of the multidimensional transducer array.

In a first aspect, a multidimensional transducer array system includes a first printed circuit board having a first surface with ends of traces. The ends of the traces electrically connect to metallic contact pads separated by kerfs in the first surface. A multidimensional transducer array has first elements in electrical contact with the metallic contact pads. An integrated circuit connects with the first printed circuit board such that signals on the contact pads are provided at the integrated circuit by the traces. The integrated circuit connects on a second surface of the first printed circuit board different than the first surface.

In a second aspect, an interconnect for electronics with an acoustic transducer array is provided. A stack of electronic modules has a planar exterior side formed by multiple of the electronic modules. The planar exterior side has conductive pads at a pitch of the acoustic transducer array. Traces in the electronic modules connect with the conductive pads. Kerfs diced into the planar exterior side separate the conductive pads.

In a third aspect, a method is provided for connecting electronics with an array of acoustic elements. A surface is formed on a circuit board. The surface includes exposed conductors of the circuit board. The circuit board includes the electronics. The surface is metalized and then diced. The array is electrically connected to the diced metalized surface.

The present invention is defined by the following claims, and nothing in this section should be taken as a limitation on these claims. Further aspects and advantages of the invention are discussed below in conjunction with the preferred embodiments and may be later claimed independently or in combination. Different embodiments may achieve or fail to achieve different objects or advantages.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

FIG. 1 is a perspective diagram of one embodiment of an electronics module for connection with a multidimensional transducer array;

FIG. 2 is a perspective diagram of a plurality of electronics modules of FIG. 1 connected with a multidimensional transducer array;

DETAILED DESCRIPTION OF THE DRAWINGS AND PRESENTLY PREFERRED EMBODIMENTS

Figure 3:
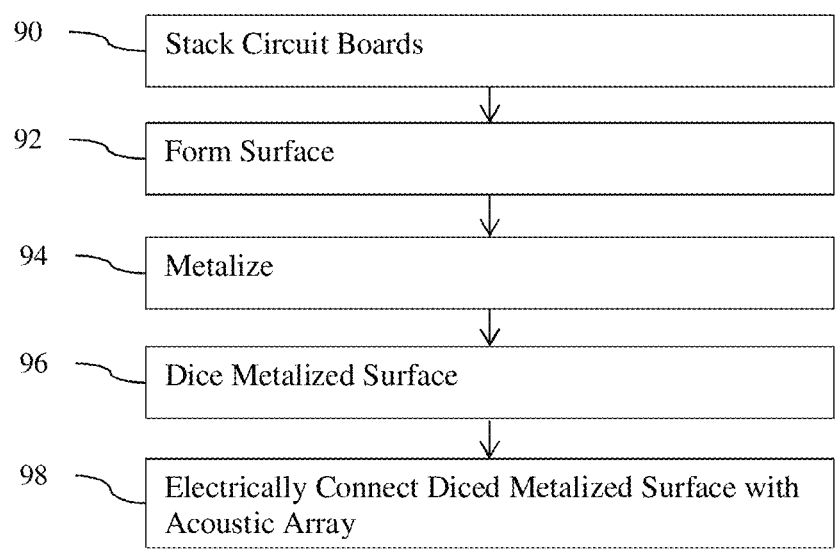
FIG. 3 is a flow chart diagram of one embodiment of a method for connecting electronics with an array of acoustic elements.

A stack of printed circuit boards forms a surface for electrical connection with an array of elements. The circuit boards in the stack include surface mounted components for electrical processing of signals to and from the transducer array. The surface for interconnection with the array provides for the electrical interconnection and includes exposed traces. To make the electrical contact more reliable, the surface is metalized and then diced. As a result, a plurality of electrically isolated contact pads is formed on the surface. The contact pads may be covered by a noble metal as a finish layer.

Low volume, low cross-talk and high electronic density are provided with modular electronics positioned adjacent to a multidimensional transducer array. Z-axis interconnections are formed in a multidimensional transducer array. A plurality of modular electronics with exposed conductors having a same pitch as the z-axis connections or the elements of the transducer array are positioned against the multidimensional transducer array or an interposing z-axis connector. Each of the modules (e.g., circuit boards) of the modular electronics has a thick section for distributing the conductors in the desired pitch. Perpendicular to the conductors in the printed circuit boards (e.g., perpendicular to conductor wiring planes), a surface is formed with contact pads and kerfs. Within the printed circuit boards, the conductors are routed to a thinner section. Electronics are provided on the thinner sections, allowing each module to have electronics without the module exceeding the thickness of the contact sub-region with the transducer array or the thick section.

FIG. 1 shows a perspective view of multidimensional transducer array system 10 for interconnection with a multidimensional transducer array. The system 10 is a modular assembly provided on a common or singular support structure of a circuit board 12. The singular support structure of the circuit board 12 of the modular system 10 includes electrical conductors or traces 14 and one or more grounding planes 18. One or more electronics components 16 connect with or are part of the singular support structure of the circuit board 12. Additional, different or fewer devices or structures may be included.

The singular support structure is a circuit board 12, such as made from FR4, Teflon or sequential buildup of materials using pressing, laminating or other techniques. Any now known or later developed circuit board material or other electrically insulative materials may be used. In one embodiment, the circuit board is a sequentially laminated printed circuit board, allowing a greater density of conductors 14, vias, and/or electronics. More precise via structures may be used for routing the conductors 14 and/or for thermal conductors.

The circuit board 12 is a singular or common support structure by being common to both electrical conductors 14 and electrical components 16. Different circuit boards may be bonded together or otherwise affixed to form a common support structure. Alternatively, the singular support structure is formed as one piece with a continuous structure.

Figure 6:
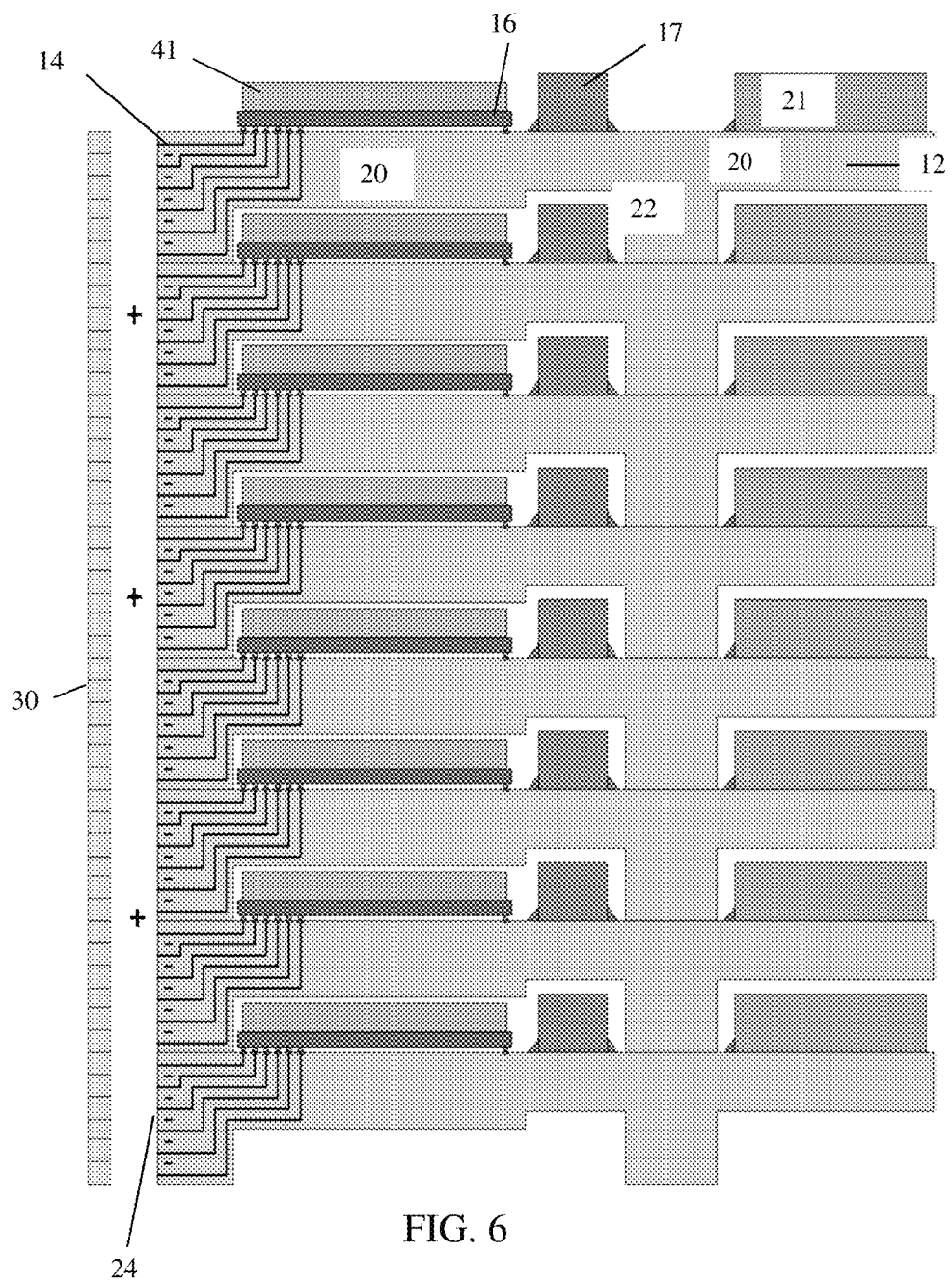
FIG. 6 shows one embodiment of a stack of electronics modules for connection with an array.

The singular support structure of the circuit board 12 includes two regions 20, 22. One region 22 is thicker along at least one dimension than the other thinner region 20. The circuit board 12 has a tiered shape. Additional tiers may be provided, such as shown in FIG. 6. In the embodiment shown in FIG. 1, the different thicknesses are provided in one dimension. The circuit board 12 has the same shape and size along other dimensions. In alternative embodiments, a further tiering or difference in size or shape may be provided along other dimensions. For example, the thinner region 20 is taller or extends to a greater extent along the vertical dimension as shown in FIG. 1 than the thicker region 22. The length or size along the dimension extending generally orthogonally from the surface 24 is as shown or different. For example, the thicker section 22 has a lesser length, allowing for a lesser size of the overall support structure 12 or additional surface area within the thinner section 20.

The thicker region 22 includes the electrical conductors 14, such as traces deposited within multiple layers on the circuit board 12 with vias or other interconnect structures for routing the conductors 14 between layers. The thinner section 20 includes the electrical conductors 14 on a fewer number of layers or thinner volume within the support structure 12 and an interconnection with one or more of the active electrical devices 16 or passive electrical devices 17 (see FIG. 6). Accounting for any type of connection or formation of the electrical devices 16, 17 on or within the circuit board 12, the thinner section 20 is thin enough such that the height of the electrical devices 16, 17 does not extend beyond the width or thickness extent of the thicker section 22. In alternative embodiments, the electronics 16, 17 extend beyond the thickness extent of the thicker section 22.

The thicker region 22 of the singular support structure 12 includes a surface 24. The electrical conductors 14 are exposed on the surface 24. Exposed includes: the conductors 14 being within divots, holes or depressions; the conductors 14 being flush with the surface 24; the conductors 14 extending beyond the surface 24, or combinations thereof. The surface 24 is an exposed edge of the circuit board material of the support structure. The ends of the conductors terminate at the surface 24.

The surface 24 is ground, machined (e.g., end mill or turning on a lathe) or cut to expose the electrical conductors 14. In alternative embodiments, the surface 24 and exposed conductors 14 are formed as part of laminating, molding, or otherwise creating the printed circuit board 12.

The exposure pattern of the electrical conductors 14 is multidimensional. For example, the conductors 14 are distributed over two dimensions on the surface 24 as shown at 26 of FIG. 1. The multidimensional exposure pattern or array of the electrical conductors 14 corresponds to a multidimensional region of an array of z-axis electrical connections of a multidimensional transducer array 30. The thick section 22 includes electrical conductors 14 stacked and routed to match the pitch or distribution to the elements of the multidimensional transducer array. For example, the multidimensional distribution of electrical conductors 14 on the surface 24 has a same or substantially same pitch along two dimensions as the elements of the multidimensional transducer array. In one embodiment, the pitch of the elements is every 400 or 500 micrometers along two dimensions. The exposed conductors 14 have a same or similar pitch. Greater or lesser pitches with the same or different pitch size along each dimension may be used. The pitch need not be a constant pitch. The pitch may vary as the traces meet the surface 24. The printed circuit boards 12 or layers within the printed circuit board 12 need not all be the same thickness or have the same trace pitch, allowing for a varying pitch across the stack of printed circuit boards 12 either of the principal directions of the array 30.

A single or multiple conductors 14 are provided for each of the elements and/or each of the z-axis electrical connections within the transducer array 30. A single electrical conductor 14 per element of the array 30 is provided, but two conductors 14 per element of the array may be provided. A biplex or two contacts per element may be used where transmit electronics are connected to one electrode of an element and receive electronics are connected to another electrode of a same element.

Figure 4:
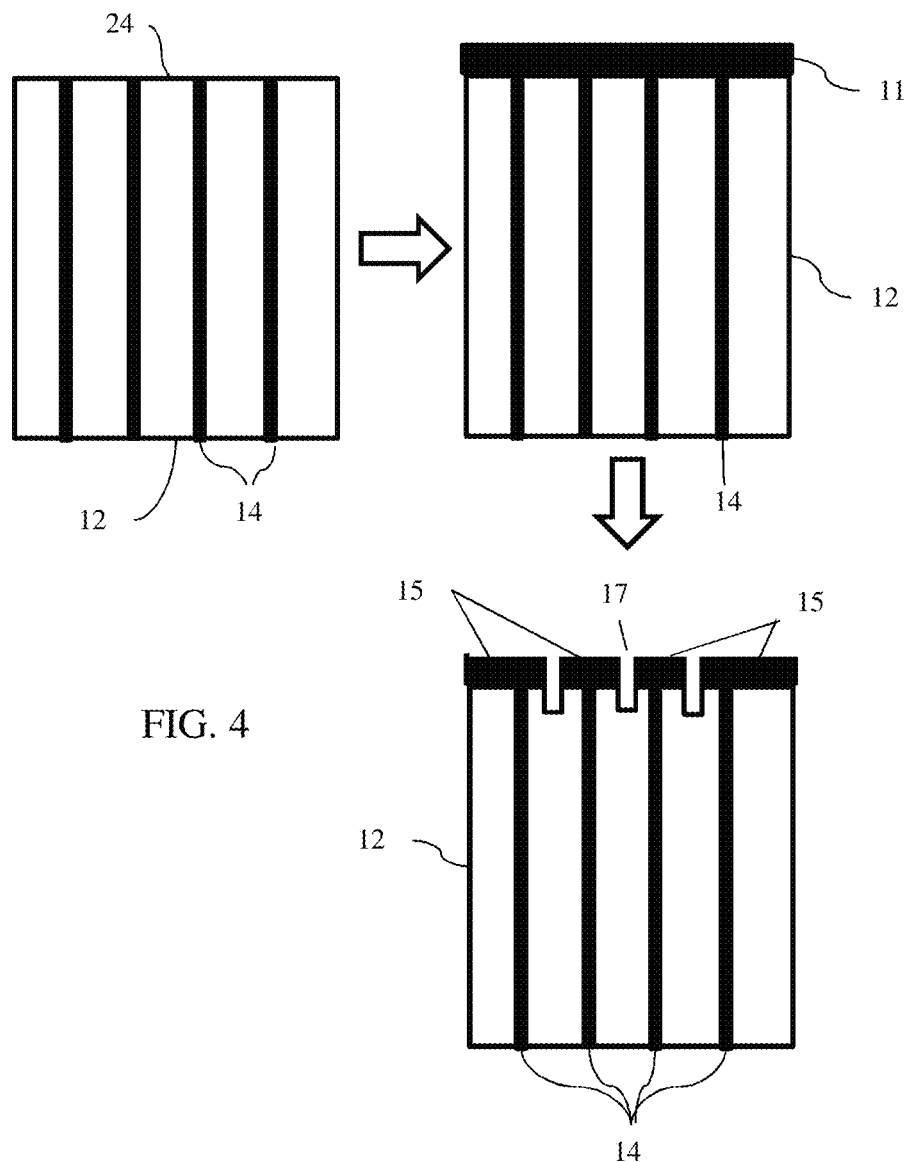
FIG. 4 illustrates a method for forming a contact surface on an electronic module, according to one embodiment.

For more reliable interconnecting with z-axis connectors or element electrodes, the conductive contact area associated with the exposed conductors 14 is increased. FIG. 4 represents a method for increasing the conductive contact area. In the upper left, the printed circuit board 12 is shown in cross-section with the surface 24 being at the top. The cross-section includes a row of conductors 14 extending to the surface 24 with ends being exposed at the surface 24, such as by machining, grinding, and/or cutting.

As shown in the lower right, the ends of the conductors 14 electrically connect to metallic contact pads 15 separated by kerfs 17 on the surface 24. None of the first printed circuit board 12 extends past the contact pads 15 of the surface 24. This arrangement provides a bump structure where the contact pads 15 are bumps on the surface 24 or on the circuit board 12, providing more reliable electrical contact when pressed against z-axis connectors or the elements of the array 30.

To form the contact pads 15, the surface 24 is metalized, providing a conductive covering 11 as shown at the upper right. Sputtering or other metal deposition is used. The conductive covering 11 may be any conductor, such as conductive material (e.g., conductive epoxy (silver epoxy) or conductive ink). In one embodiment, the conductive covering 11 includes different materials and/or layers. For example, a titanium layer is deposited to connect with the ends of the conductors 14 on the surface 24. A thicker copper layer is deposited on the titanium layer. A noble metal is deposited on an outer or top surface to prevent oxidization. For example, a final layer of gold is deposited. Gold may be deposited with sputtering or other clean and dry process.

Figure 5:
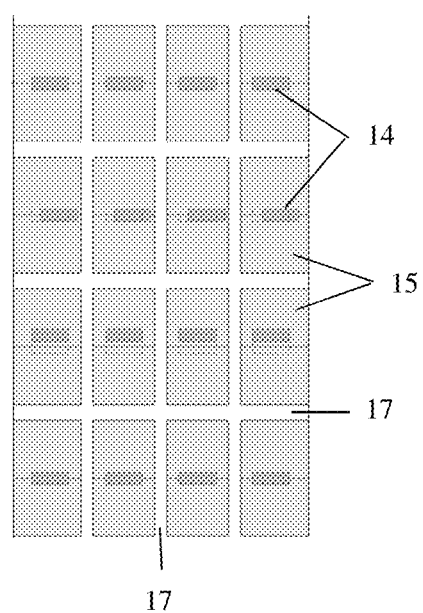
FIG. 5 illustrates a perpendicular view of a top surface of the electronics module.

To form the contact pads 15, the surface 24 with the conductive cover 11 is diced. The dicing forms kerfs 17 through the conductive covering 11 and into the printed circuit board 12. The dicing is in a grid pattern, such as shown in FIG. 5. Other patterns may be used.

The kerfs 17 in the surface 24 are patterned to match kerfs separating the elements of the multidimensional transducer array, to match a distribution of z-axis connectors (conductors), and/or to match a pattern of conductors of the array 30 or an interposer or intervening connector. The kerfs 17 in the surface 24 may be wider, narrower, or a same width as kerfs of the array. In one embodiment, the kerfs are about 50 um, where "about" provides for manufacturing tolerance. By dicing in a same or similar pattern, the contact pads 15 have a same or similar (e.g., 10% tolerance or tolerance less than a width of a kerf 17) pitch as elements of the array 30. FIG. 5 shows a portion of the surface 24 where the contact pads 15 are electrically isolated by the kerfs 17 and electrically connect to the exposed conductors 14 by contact.

The creation of the contact pads 15 provides larger conductive surfaces for more reliable electrical connection to the array 30. In one embodiment, the contact pads 15 are 10 or more times larger in area on the surface 24 than the exposed conductors 14. For example, the contact pads 15 are 230×325 um$^2$ and the exposed conductors are 140×35 um$^2$ at the surface 24. The contact pads 15 have about 15 times the surface area as the exposed conductors. The contact pads 15 provide a larger electrically conductive bonding area.

The larger area created by patterning the metallization by dicing provides for greater tolerances to azimuthal and elevation deviation. The contact pads 15 compensate for deviation or tolerances of the conductor 14 placement within the circuit board 12, deviations or tolerances of the conductors 14 or board thickness between different circuit boards 12 stacked together to form the surface 24, and/or other sources of azimuth variation. The contact pads 15 compensate for deviation or tolerances of thickness of the circuit board 12, deviation or tolerances of thickness of the bond layer between circuit boards of a stack, deviation or tolerances of the conductor 14 placement within the circuit board 12, and/or other sources of elevation variation. FIG. 5 shows four rows. For showing deviation, the ends of the conductors 14 in the second row are shifted to the right in the elevation dimension. Dashed lines show the centered position. The ends of the conductors 14 in the third row are shifted up, showing deviation in the azimuth dimension.

By forming the contact pads 15 as the uppermost part of the surface 24, tolerance or deviation in the z-axis (i.e., depth or range dimension) is more easily dealt with. The arrangement may allow for electrical contact even where coplanarity between the surface 24 and array 30 or an interposer (z-axis connector) is off. Warpage of the circuit boards 12 may be less likely to result in lack of electrical contact.

The contact pads 15 allow for z-axis interconnection directly to the surface of the multidimensional transducer array 30, but may be indirectly connected in other embodiments. An interposer placed between the surface 24 and the array 30 may be used. The interposer routes signals and corresponding wires, traces or conductors from the contact pads 15 to the elements of the arrays 30.

Once assembled adjacent to a multidimensional transducer array 30, the surface 24 and contact pads 15 are in contact with z-axis electrical connections of the transducer array 30. In alternative embodiments, electrical interconnections other than z-axis electrical interconnections are provided on the transducer array 30, such as direct connection to electrodes of the acoustic elements. The distribution of the contact pads 15 is used to correspond to the distribution pattern used for the transducer array 30 whether with z-axis or other electrical interconnects.

Bump connections, wire bonding or other connection techniques for connecting the contact pads 15 to the z-axis electrical connections of the transducer array 30 may be used. In one embodiment, an anisotropic conductive adhesive is used. For example, epoxy with gold plated material or other directionally oriented conductors are used to both bond the array 30 to the surface 24 and increase electrical connection where actual physical contact may not occur or may be limited. The adhesive may acoustically reduce coupling between contact pads 15 by filling the kerfs 17. Alternatively, another kerf filler is used.

The electrical conductors 14 are traces or other metallic conductors, such as copper or gold conductors. Paste or other conductive materials may be used. The conductors 14 are formed by deposition, etching, printing or other now known or later developed technique for placing conductors 14 on or in a circuit board or other structure with or without vias or other multilayer structures. Vias or other electrical conductors 14 may extend through the ground planes 18. The electrical conductors 14 within the assembly 10 are routed in any of various patterns, such as by providing the electrically isolated conductors 14 for conducting signals from different z-axis interconnections or elements of a transducer array 30 to different inputs of the same or different electronic devices 16, 17. Different electrical conductors 14 contact different ones of the z-axis electrical connections or acoustic elements at the surface 24. The conductors 14 then route through the thick section 22 to the thinner section 20 for connection with electronics 16, 17 or a connector 21 (see FIG. 6). The electrical conductors 14 route to active electrical devices 16 (e.g., transistors and/or integrated circuit) and/or passive electrical devices 17 (e.g., resistors, capacitors, and/or inductors). The routing of the electrical conductors 14 within the thicker region 22 is used to redistribute the signal traces onto a fewer number of layers or lesser volume of the thinner section 20. The redistributed electrical conductors 14 are then patterned or otherwise formed to connect with different ones of the electrical components.

The electrical components 16 are semiconductors, such as transistor devices. "Active" electrical component is used to convey a type of device rather than operation of the device. Transistor based or switch based devices are active while resistors, capacitors or inductors are passive devices. The active electrical devices 16 are one or more integrated circuits. Other electrical devices may be used. The integrated circuits or other electrical devices may include application specific integrated circuits, analog circuits, digital circuits, switches, multiplexers, controllers, processors, digital signal processors, field programmable gate array, or other now known or later developed active electrical component. The active electrical component 16 may be in a chip as an integrated circuit. In one embodiment, a single active electrical component, such as a single chip, is provided. As shown, different or a plurality of active electrical components 16 are provided. For example, a plurality of transmit circuits are provided as semiconductors chips, a plurality of receive circuits are provided as semiconductor chips, and a controller is provided as a semiconductor chip. The transmit components are separate from the receive components. Transmit components include high voltage pulsers, filters, memories, delays, phase rotators, multipliers, combinations thereof or other now known or later developed transmit beamformer component. The receive components include filters, amplifiers, delays, summers, combinations thereof or other now known or later developed receive beamformer component. Since receive beamformer components may operate at lower voltages than the transmit components, the receive and transmit components are separate devices, but a combination device for the transmit and receive operation may be provided. In one embodiment, the transmit and receive active electrical devices are formed as a same semiconductor device, such as disclosed in U.S. Pat. No. 6,380,766, the disclosure of which is incorporated herein.

FIG. 6 shows one example grouping of components. The conductors 14 route to an integrated circuit as the electronics device 16. Cooling fins or another cooling structure may be provided on the integrated circuit. The conductors 14 also route to passive electronics 17 (e.g., a capacitor, resistor, and/or inductor), and/or a connector 21.

The active electrical components 16, passive electronics 17, and/or connector 21 are formed within or connected to thinner section 20 of the singular support structure 12. For example, a flip-chip mounting or silicon die with a bump bond is used to connect the active electrical component 16 to the circuit board 12 and the electrical conductors 14. Flip-chip mounting may minimize the height of the electrical components 16, avoiding an extension beyond the thickness of the thicker section 22. Wire bonding or surface mount technology may be used in other embodiments. Depressions may be used in the thinner section 20 for inserting the active electrical components within the circuit board 12.

FIG. 1 shows an example where the thinner section 20 forms a gap relative to the thicker section 22. The electrical components 16 are placed in this gap, allowing for stacking of circuit boards 12 without gaps. For example, the thinner section 20 is created by machining away part of the circuit board 12 and the electrical components 16 are placed on the machined surface. In another embodiment, the electrical components 16 are connected to a non-machined surface. FIG. 6 shows an example. While thinner regions 20 are created in the circuit board 12, the electrical components 16 are placed on the original surface of the circuit board 12. One planar surface extends along all or most of the circuit board 12 perpendicular to the surface 24. The opposite side has portions removed to form the thinner regions 20. The electrical components 16 are positioned on the flat side. In stacking, the thinner sections 20 of adjacent circuit boards 12 provide the space or gap for the electrical components 16. The electrical components 16 and/or other surface mounted components (passive electronics 17 and connector 21) fit in recesses in adjacent circuit boards 12. This allows for easier manufacture or connection of the electrical components 16 to the circuit board 12.

The electrical conductors 14 of the assembly 10 connect with the electrical components 16. The electrical conductors 14 route signals from the multidimensional transducer array 30 or z-axis interconnections at the surface 24 to various ones of the electrical components 16. Additional electrical conductors 14 may interconnect different electronic components 16 or the electronic components to connectors 21, such as a system interconnection. The connection may be direct from the surface 24 to the active electronic devices 16 or may be through one or more passive electronics devices 17. In one embodiment, a single electrical conductor 14 connects with both a transmit and receive active electrical component 16, such as through a transmit and receive switch connected on or within the circuit board 12. The same conductor 14 is then used for both transmit and receive operations for a particular element or z-axis interconnection of the multidimensional transducer array 30. Alternatively, separate electrical conductors 14 are provided for transmit or receive operation with a same element. In yet another embodiment, each element is restricted to only transmit or receive operation.

Figure 7:
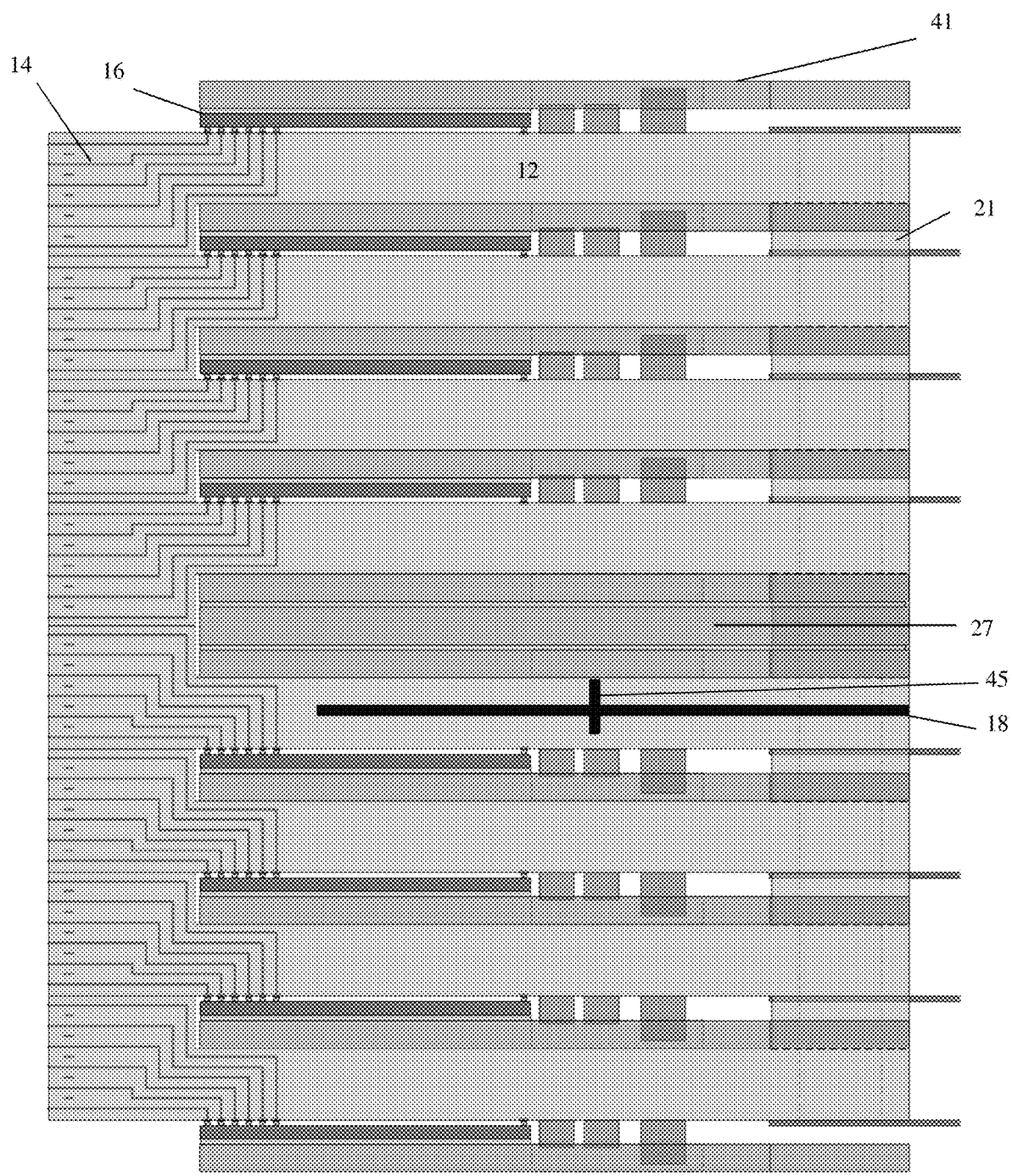
FIG. 7 shows one embodiment of electronics modules stacked in a mirrored arrangement with thermal management.

Referring to FIGS. 1 and 7, the grounding plane 18 is a metallic structure formed within the circuit board 12, such as a grounding plane. In FIG. 7, the grounding plane 18 and one example thermally conductive via 45 are shown in one circuit board 12 to avoid clutter, but may be provided in all or a subset of the circuit boards. In some designs, the ground plane 18 is an array return capacitively coupled to ground rather than resistively connected to ground, allowing a DC bias voltage on the array elements via the ground plan 18.

In one embodiment, one or more grounding planes 18 include a connector or other trace for connection to a heat sink. In an alternative or additional embodiment, one or more metallic fins 41 are positioned adjacent to the thinner region 20 of the circuit board 12 by placement over the active electrical components 16 and/or other components 17, 21. For example, metallic heat distribution fins 41 are inserted above the components 16. The fins may be connected with a heat sink. The heat sink provides either passive or active cooling. The fins 41 or other thermal conductor are just over the electronic devices 16 (e.g., as shown in FIG. 6) or extend over various devices 16, 17, and/or 21 through the thinner region 20 (e.g., as shown in FIG. 7). The thermal conductor 41, thermally conducting ground plane 18, and/or conductive vias 45 interconnect with each other and/or are separate. By providing these thermal conductors 18, 41, 45 within or on a circuit board 12 in the stack, active or passive cooling may be provided. Before the circuit boards are stacked, the thermal conducting sheets or conductors 41 may be attached either to the top of heat producing components, or attached to the side opposite the heat producing components to provide heat sinking for the adjacent circuit board.

The circuit boards 12 are stacked. FIG. 2 shows one embodiment of a system 28 for interconnection with a multidimensional transducer array 30. The system includes a plurality of modular assemblies 10, the multidimensional transducer array 30, and a system interconnection 32. Additional, different or fewer components may be provided. The system 28 is positioned within a probe housing.

The system 28 is sized to fit within a hand-held probe. For example, the circumference or shorter two dimensions of the system 28 is sized to allow a user to position their hand around at least most the probe housing. Alternatively, the probe housing is larger and has a handle for user control. The length or longest dimension of the assembly 28 shown in FIG. 2 is less than 12 inches or about six inches, but other lengths (e.g., less than 2 inches) may be provided.

The multidimensional transducer array 30 is an array of piezoelectric or microelectromechanical (capacitive membrane) elements. The elements are distributed along two dimensions. The array is flat, concave or convex. Full or sparse sampling is provided. The elements are distributed along any of various pitches, such as every 400 or 500 micrometers, in a fully sampled spacing along two dimensions. Each of the elements of the array 30 includes at least two electrodes. The elements transduce between electrical and acoustical energies. A backing block may be positioned on one side of the array for limiting acoustic reflection from energy transmitted in an undesired direction. Matching layers, a lens, a window, or other now known or later developed multidimensional transducer array components may be included.

In another embodiment, the array 30 is one-dimensional. The modular assemblies 10 connect for operation with different elements along the lateral or azimuth dimension of the array 30.

For connection with the transmit and receive beamformer or other circuitry, a plurality of z-axis electrical connections are provided with the multidimensional transducer array 30. The z-axis electrical connections are distributed as an array. For example, a plurality of electrical interconnections connects one or more electrodes of each element through a backing block. The z-axis electrical connections are distributed in a same pitch and distribution as the elements of the array 30. The z-axis is more orthogonal than parallel with the surface of the distribution of the elements of the array (i.e., the z-axis corresponds to the depth or range dimension). The z-axis electrical connections form an array of exposed ends of conductors (e.g., wires or traces) on a backing block surface of the transducer array 30. Alternatively, the z-axis electrical connections are formed on the transducer material without the backing block, such as the electrodes of the acoustic elements being the z-axis electrical connections.

The array of z-axis connections may have a different pitch than the array 30 of elements, such as associated with angling the z-axis connections through the backing block to have greater separation or greater pitch. As another example, the electrical connections for one or more groups of elements are routed together. In alternative embodiments, indirect connection is provided through one or more electrical trace routers, flex circuits or other interposing devices.

The modules 10 (e.g., circuit boards 12) form an interconnect for the electronics 16, 17 with the acoustic transducer array 30. The circuit boards 12 are stacked adjacent to each other. Any number may be stacked, such as 3-15. In one embodiment, the array 30 includes an arrangement of 96×72 elements. 12 circuit boards 12 are stacked to provide contact pads 15 distributed in the 96×72 pattern. This stack provides for 6,912 electrically isolated connections (i.e., 6,912 contact pads 15 electrically connected to 6,912 acoustic elements).

The circuit boards 12 are stacked with a same orientation. FIG. 6 shows an example where each circuit board 12 has a same orientation (i.e., electrical components 16 are mounted upward in the drawing for each circuit board 12). In other embodiments, the orientation varies through the stack. For example, half of the circuit boards 12 are oriented in an opposite direction. FIG. 7 shows an example where circuit boards 12 are stacked in a mirrored manner. The mirroring is between or relative to the center two circuit boards 12 of the stack. Circuit boards 12 on the top have a same orientation, and the circuit boards 12 on the bottom have a same orientation. This creates a stack with a mirrored arrangement. This mirroring may reduce the influence of warpage common to multiple of the circuit boards. Other arrangements, such as mirroring about the stack in a location other than the center or every other pair, may be used.

Other structures may be placed in the stack. For example, one or more thermal conductors 27 (see FIGS. 7 and 8) are included between one or more pairs of the circuit boards 12. Rather than or in addition to any thermal conductors (e.g., ground plane 18 or vias 45) within any circuit board 12, a thermal conductor 27 is provided as part of the stack or adjacent to the stack. FIG. 7 shows the thermal conductor 27 in addition to the fins 41 positioned at the center of the stack in a gap caused by the mirroring and the fins 41 being thinner. In alternative embodiments, the fins 41 are thinner or the fins 41 and thermal conductor 27 are formed as one device. Using passive or active conduction, heat generated by the electrical components 16 and/or the array 30 may be more rapidly removed. Any thermal conductor 27 may be used, such as a metal slab, fins, or tubes.

As shown in FIG. 2, the stack of modular assemblies 10 are positioned adjacent to the multidimensional transducer array 30. The positioning provides electrical contact of the elements of the multidimensional transducer array 30 with the metallic contact pads 15. While three assemblies 10 are shown with a two-dimensional region of z-axis interconnections 36 exposed without an adjacent modular assembly, additional modular assemblies are positioned over the exposed z-axis connections 36 so that each of the z-axis connections connects with a module 10. In alternative embodiments, less than all the z-axis connections are connected with or positioned adjacent to a module 10. The surface 24 with the contact pads 15 is positioned adjacent to the multidimensional transducer array 30, such as adjacent to the exposed z-axis connections of a backing block or exposed electrodes of the acoustic elements. Each of the exposed surfaces 24 of the circuit boards 12 connects with a subset of the elements and associated z-axis electrical connections. As shown, each subset includes entire columns but only portions of rows of elements. In alternative embodiments, a module 10 corresponds to a region with a lesser azimuth and/or elevation extent, a greater elevation extent, or a lesser azimuth extent. Other regions of the multidimensional transducer array and associated z-axis connections 36 are adjacent to other modules 10.

By positioning modules adjacent to one another, the contact pads 15 physically contact and/or are electrically connected with of the z-axis connections 36. For example, the contact pads 15 are electrically connected with the z axis connections 36 by bump bonding, asperity contact, wire bonding, anisotropic conducive adhesion, or other now known or later developed technique. The pitch of the contact pads 15 and positioning is substantially the same as the pitch and positioning of the z-axis electrical connections 36. The thicker portions 22 of each of the modules 10 is sized to cover the z-axis connections 36 desired without covering other z-axis connections 36. Since the thickness matches the contact pitch of the acoustic array 30, a plurality of modules 10 may be positioned adjacent to each other.

Tolerance errors in the thickness may be accommodated by grinding or shimming between the modules 10. For example, printed circuit board material, film or an epoxy is positioned between the circuit boards 12. In yet another embodiment, the electronic modules 10 are pre-aligned and bonded together to obtain a desired mechanical alignment. The entire structure is then positioned adjacent to the transducer array 30. The thicker regions 22 are generally in contact with each other between different modules 10. The thinner regions 20 are free of contact with each other. Alternatively, posts, metal fins, or other structure of the thinner region of one module contacts the thinner region of another module.

The stack of circuit boards 12 of the electronic modules 10 forms a planar exterior side from the surfaces 24. Non-planar arrangements may be used, such as a curved surface (e.g., for forming a curved multi-dimensional array). The stacking may form the surface for mating with the array 30 or interposer. Alternatively, the circuit boards 12 are stacked and then the surface is formed by machining the stack.

Contact pads 15 are formed on the surface of the stack. In one embodiment, the contact pads 15 are formed in the circuit boards 12 prior to stacking. In another embodiment, the contact pads 15 are formed on the stack of circuit boards 12 after stacking. Rather than separately forming contact pads 15 in each circuit board 12, the stack creates a common surface on which the contact pads 15 are formed together.

The contact pads 15 are formed as discussed above for FIG. 4. FIG. 3 shows one embodiment of a method for connecting electronics with the array 30 of acoustic elements. The method forms the contact pads 15 on the surfaces 24 after stacking the circuit boards 12. Additional, different, or fewer acts may be provided.

In act 90, the stack is formed. A plurality of circuit boards 12 are stacked together. Each of the circuit boards 12 forms part of the surface for interconnection with the array 30. The stack is bonded together, but a press-fit, clamp, or other connection may be used.

In act 92, the surface is formed on the stack, forming surfaces 24 on the circuit boards 12 of the stack. The surface on the stack is formed by machining, grinding, etching, or cutting. Alternatively or additionally, the surface is formed by stacking with guides or other structure to align the circuit boards 12 to provide the surface.

The formation of the surface exposes the conductors 14. The traces on or in the circuit boards 12 are exposed to allow electrical connection.

In act 94, the surface with the exposed conductors 14 is metalized. A layer of one or more conductive materials is formed on the surface. The layer covers all or most of the surface. For example, gold, copper, and/or titanium are deposited on the surface using sputtering. Other or no noble metals may be used. Any thickness may be provided. The metallization forms the layer in contact with the conductors 14 and covering the conductors 14 plus additional area.

In act 96, the metalized surface is diced. A saw cuts through the metalized surface and into the circuit board 12. Alternatively, etching is used. In an alternate process, an acoustic stack not yet diced is attached to surface 24, before surface 24 is diced, and the acoustic stack and surface 24 are diced in one dicing operation after the acoustic stack is attached to module 28.

The dicing is in a pattern to create the contact pads 15 distributed at the desired pitch. For example, the same dicing pattern to create the elements of the array 30 is used to create the contact pads 15. The pitch of the dicing of the surface matches the pitch of the acoustic elements. The dicing electrically isolates the contact pads 15 from each other.

In act 98, the array 30 is electrically connected to the diced, metalized surface. Individual ones of the electrically isolated contact pads 15 are electrically connected to individual ones of the acoustic elements. For direct bonding of the stack to the array 30 or interposer, the acoustic elements or interposer are placed in contact with the electrically isolated contact pads 15.

The multidimensional transducer array 30 is electrically connected with the integrated circuit 16 or other electronics each of the modules 10. The z-axis interconnections of each region corresponding to different modules 10 connects to electrical components 16 of the corresponding module through the contact pads 15 and respective conductors 14. By connecting contact pads 15 of each of the modules 10 to different ones of the z-axis connectors of the array 30, different z-axis connectors and associated elements are connected with different electrical components 16, 17.

Figure 8:
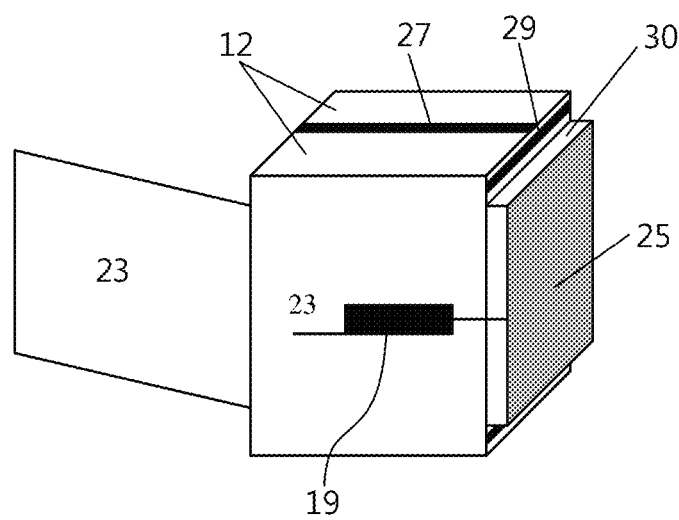
FIG. 8 shows one embodiment of a stack of electronics modules mated with an array.

Other electrical connections may be formed. For example, one or more of the circuit boards 12 includes exposed pads 19 on an edge or surface pads 29 other than the surface 24. FIG. 8 shows a stack with one of the circuit boards 12 including a contact pad 19. More than one contact pad 19 may be used on the same or other circuit boards 12. The ground plane or electrode 25 of the array 30 is electrically connected to the contact pad 19, such as with a wire bond, jumper wire, or copper foil. Alternatively, the ground plane or electrode 25 is extended to cover the contact pad 19 or surface pads 29 and their electrical interconnections are made by Ohmic contact or asperity contact. Connections for control signals, transducer identification, communications, or other purposes than acoustic scanning or grounding may be provided.

Asperity contact, bump bonding, wire bonding, surface mount technology, anisotropic conductive adhesive, or other connections may be used for connecting the contact pads 15 with the z-axis connectors of the multidimensional transducer array 30. The electronics are modular, providing different electronics chips or devices for different modules. The same circuit or different circuit is provided for each of the chips or modules.

Bonding, laminating, mechanical connection (e.g., bolt, screw or latch) or pressure may be used to position and maintain the modules 10 adjacent to the acoustic array 30. Tongue and groove, extensions and holes or other structures may be used to assist in alignment or positioning of the modules 10 adjacent to the multidimensional acoustic array 30. By using a plurality of modules 10, each module may be separately tested. Upon the failure of a part, less than the entire collection of electronics, assembly with the transducer array 30, or probe is discarded. In one embodiment, the modules 10 are bonded together before connection and bonding with the array 30. Alternatively, the modules 10 are bonded to the array 30 individually or at a same time as separate components. As an alternative to using modules, a single assembly is provided that extends along the entire two-dimensional extent of the multidimensional transducer array 30.

Printed circuit boards or end plates may be placed at the top and bottom of the stack (relative to FIG. 2) to protect and shield the electrical components and provide electrode surfaces for connecting ground or array return (surface pads 29).

The electrical components 16 of each of the modules are used for beamforming. For example, transmit beamforming is provided. Waveforms are generated, delayed, apodized and/or filtered by the active components as part of the transmit beamforming operation. The conductors 14 are then used to route signals to the elements of the transducer array 30 for conversion to acoustic energy. As another example, the active component delays, amplifies, phase rotates, sums, filters or performs other receive beamforming operations associated with one or multiple of the elements of the transducer array 30. For example, partial beamforming corresponding to the entire region associated with a given module or corresponding to a plurality of sub-regions of the region associated with the given module is performed. The partially beamformed signals are routed to a system for imaging.

Referring again to FIG. 2, the system interconnection device 32 is a circuit board, connector, cables or other now known or later developed device for electrically connecting each of the modules 10 and the corresponding electronics 16 to an imaging system (e.g., ultrasound scanner). For example, flex connectors 21 (see FIG. 6) are provided on each of the modules 10, such as within the thin regions 20. In another example, flex 23 attaches directly to board 12 instead of a connector 21 with a connector at the opposite end of that flex to connect to the ultrasound scanner.

The flex connectors 21 are then used to connect to the coaxial cables 34 via the flex 23 (i.e., flexible circuit material with traces for conducting signal (see FIG. 8). Flex 23 may be used to connect with the ultrasound scanner without cables 34 in alternative embodiments or the cables 34 may connect directly to the connector 21. As another example, an interconnection circuit board is positioned adjacent to the exposed edges at the end of the modules 10 at the thinner region 20. Bump bonding, wire bonding, edge connectors or other techniques are used to connect electrical conductors on the edge or other surfaces of the thinner region 20 to the interconnection board.

In one embodiment, the active electronic 16 act to reduce the number of signal traces or electricals conductors needed to connect with the imaging system. For example, partial beamforming, beamforming, multiplexing, subarray mixing, combinations thereof, or other now known or later developed technique for combining signals from a plurality of inputs to a fewer number of outputs is provided. By having a reduced number of signal lines, a fewer number of connections between the system interconnection device 32 and each of the modules 10 is used. In an alternative embodiment, the active electronics 16 do not reduce the number of signal lines.

While the invention has been described above by reference to various embodiments, it should be understood that many changes and modifications can be made without departing from the scope of the invention. It is therefore intended that the foregoing detailed description be regarded as illustrative rather than limiting, and that it be understood that it is the following claims, including all equivalents, that are intended to define the spirit and scope of this invention.

We claim:

1. A multidimensional transducer array system, the system comprising:
    a first printed circuit board having a first surface with ends of traces, the ends of the traces electrically connecting to metallic contact pads separated by kerfs in the first surface;
    a multidimensional transducer array having first elements in electrical contact with the metallic contact pads, wherein the kerfs in the first surface are patterned to match kerfs separating the first elements of the multidimensional array; and
    an integrated circuit connected with the first printed circuit board such that signals on the contact pads are provided at the integrated circuit by the traces, the integrated circuit connected on a second surface of the first printed circuit board different than the first surface.

2. The system of claim 1 wherein the ends of the traces and the contact pads on the first surface have a first pitch of the first elements of the multidimensional transducer array.

3. The system of claim 1 wherein the metallic contact pads include a noble metal layer.

4. The system of claim 1 wherein none of the first printed circuit board extends past the contact pads of the first surface.

5. The system of claim 1 further comprising ground pads on the first surface or a third surface of the first printed circuit board, the ground pads electrically connected with a ground of the multidimensional transducer array.

6. The system of claim 1 wherein the integrated circuit comprises an application specific integrated circuit with preamplifiers, transmit pulsers, and passive electronics.

7. The system of claim 1 further comprising at least second, third, and fourth printed circuit boards stacked with the first printed circuit board, the second, third, and fourth printed circuit boards having ends of traces in a same surface formed in part by the first surface and having metallic contact pads separated by kerfs on the plane, second, third, and fourth groups of elements of the multidimensional transducer array electrically connected with the metallic contact pads of the second, third, and fourth printed circuit boards.

8. The system of claim 7 further comprising a thermal conductor between the second and third printed circuit boards.

9. The system of claim 7 wherein the second surface of each of first and second printed circuit boards is along a plane perpendicular to the plane of the first surface, the second surfaces being flat over an entirety of the first and second printed circuit boards, the integrated circuit of the first printed circuit board being on the second surface of the first printed circuit board, the integrated circuit fitting into a recess of the second printed circuit board on a side opposite the second surface of the second printed circuit board.

10. The system of claim 7 wherein the first, second, third, and fourth printed circuit boards are stacked in a stack, the stack mirrored about a center.

11. An interconnect for electronics with an acoustic transducer array, the interconnect comprising:
    a stack of electronic modules, the stack having a planar exterior side formed by printed circuit boards of multiple of the electronic modules, the planar exterior side having conductive pads at a pitch of the acoustic transducer array;
    traces in the printed circuit boards of the electronic modules connecting with the conductive pads; and
    kerfs diced into the planar exterior side formed by the printed circuit boards, the kerfs separating the conductive pads.

12. The interconnect of claim 11 wherein the conductive pads are coated in a noble metal.

13. The interconnect of claim 11 wherein the conductive pads have a surface area on the planar exterior side at least ten times greater than ends of the traces connected with the conductive pads.

14. A multidimensional transducer array system, the system comprising:
    a first printed circuit board having a first surface with ends of traces, the ends of the traces electrically connecting to metallic contact pads separated by kerfs in the first surface, wherein the contact pads have a surface area parallel to the first surface at least ten times greater than the ends of the traces;
    a multidimensional transducer array having first elements in electrical contact with the metallic contact pads; and
    an integrated circuit connected with the first printed circuit board such that signals on the contact pads are provided at the integrated circuit by the traces, the integrated circuit connected on a second surface of the first printed circuit board different than the first surface.

15. A multidimensional transducer array system, the system comprising:
    a first printed circuit board having a first surface with ends of traces, the ends of the traces electrically connecting to metallic contact pads separated by kerfs in the first surface, wherein the first printed circuit board comprises a sequentially laminated printed circuit board;
a multidimensional transducer array having first elements in electrical contact with the metallic contact pads; and
an integrated circuit connected with the first printed circuit board such that signals on the contact pads are provided at the integrated circuit by the traces, the integrated circuit connected on a second surface of the first printed circuit board different than the first surface.

16. A multidimensional transducer array system, the system comprising:
a first printed circuit board having a first surface with ends of traces, the ends of the traces electrically connecting to metallic contact pads separated by kerfs in the first surface;
a multidimensional transducer array having first elements in electrical contact with the metallic contact pads;
an integrated circuit connected with the first printed circuit board such that signals on the contact pads are provided at the integrated circuit by the traces, the integrated circuit connected on a second surface of the first printed circuit board different than the first surface; and
a flex connected with the first circuit board, the flex having conductors for electrically connecting the integrated circuit with an ultrasound scanner.

* * * * *